(12) United States Patent
Burckel et al.

(10) Patent No.: US 9,513,554 B1
(45) Date of Patent: Dec. 6, 2016

(54) LITHOGRAPHICALLY DEFINED MICROPOROUS CARBON-COMPOSITE STRUCTURES

(71) Applicant: Sandia Corporation, Albuquerque, NM (US)

(72) Inventors: David Bruce Burckel, Albuquerque, NM (US); Cody M. Washburn, Albuquerque, NM (US); Timothy N. Lambert, Albuquerque, NM (US); Patrick Sean Finnegan, Albuquerque, NM (US); David R. Wheeler, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/749,328

(22) Filed: Jun. 24, 2015

Related U.S. Application Data

(60) Provisional application No. 62/017,759, filed on Jun. 26, 2014.

(51) Int. Cl.
*G03F 7/40* (2006.01)

(52) U.S. Cl.
CPC .................... *G03F 7/40* (2013.01)

(58) Field of Classification Search
CPC ........................................ G03F 7/40
See application file for complete search history.

(56) References Cited

U.S. PATENT DOCUMENTS

| 7,232,650 B2 * | 6/2007 | Leatherdale | G02B 6/1221 385/129 |
| 8,349,547 B1 * | 1/2013 | Burckel | G03F 7/0015 430/322 |
| 2006/0068107 A1 * | 3/2006 | Madou | B81C 1/00111 427/249.1 |

OTHER PUBLICATIONS

Washburn, "Tunable Young's Modulus in Carbon MEMS usin Graphene-based Stiffeners", ECS Transactions, 50 (12), 2012, pp. 423-434.*

* cited by examiner

*Primary Examiner* — Kathleen Duda
(74) *Attorney, Agent, or Firm* — Martin I. Finston

(57) ABSTRACT

A microporous carbon scaffold is produced by lithographically patterning a carbon-containing photoresist, followed by pyrolysis of the developed resist structure. Prior to exposure, the photoresist is loaded with a nanoparticulate material. After pyrolysis, the nanoparticulate material is dispersed in, and intimately mixed with, the carbonaceous material of the scaffold, thereby yielding a carbon composite structure.

5 Claims, 11 Drawing Sheets

LITHOGRAPHICALLY DEFINED MICROPOROUS CARBON-COMPOSITE STRUCTURES

CROSS-REFERENCE TO RELATED APPLICATION

This application claims priority to U.S. Provisional Patent Application No. 62/017,759, filed on Jun. 26, 2014 under the title, "LITHOGRAPHICALLY DEFINED MICROPOROUS CARBON-COMPOSITE STRUCTURES", the entirety of which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to porous carbon materials and, in particular, to lithographically defined microporous carbon structures.

BACKGROUND OF THE INVENTION

The special nature of the C—C bond can lead to various polymorphic forms of carbon, such as graphite, glassy-carbon, fullerenes (such as buckyballs), carbon nanotubes and diamond. In addition to the intrinsic material properties of carbon, functionalized films can be produced through chemical modification using a wide range of chemistries. Because of this flexibility and utility, fabrication of both macroporous and microporous carbon films, with their concomitant increase in surface area, continues to receive significant research interest. Some of the specific applications for porous carbon materials include fuel cells, electrochemical double layer capacitors, high surface area catalytic supports, water purification, and gas separation.

In particular, electrodes made from carbon exhibit many useful properties including wide potential windows, low background capacitance, resistance to fouling, and catalytic activity for many analytes compared to solid metal electrodes. The nanostructuring and/or microstructuring of electrodes can lead to high-surface-area, catalytically active interfaces. Such modifications can be achieved by tuning particle size and shape, making the catalytic surface in porous networks, or dispersing catalytic particles into porous templates.

The performance of microporous carbon in the applications described above, among others, will often be limited by a tradeoff between surface area and mass transport. That is, the total (potentially reactive) surface area of a porous body of constant mass increases as the pore size decreases. Hemispherical diffusion, which is favorable for many applications involving interfacial reactions, also tends to control the mass transport when the pores are relatively small. As the pores continue to decrease in diameter, however, the penetration depth of reactant liquids may become severely limited, and due to overlapping diffusion layers, linear diffusion profiles may supplant hemispherical diffusion profiles.

Hence to optimize the performance of microporous carbon structures, it is desirable to provide not only high surface area, but also uniform and controllable dimensions.

U.S. Pat. No. 8,349,547, which issued on Jan. 8, 2013 to D. B. Burckel et al. under the title, "Lithographically Defined Microporous Carbon Structures," and which is assigned to the assignee hereof, describes one technique for forming microporous carbon structures that is capable of providing uniform and controllable dimensions. The entirety of the abovesaid U.S. Pat. No. 8,349,547 is hereby incorporated herein by reference.

U.S. Pat. No. 8,349,547 describes a method of depositing a carbon-containing photoresist onto a substrate, lithographically defining a microporous structure in the deposited photoresist, developing the lithographically defined photoresist, and pyrolyzing the developed photoresist to provide a microporous carbon scaffold. The microporous carbon scaffold can be functionalized with, e.g., metal nanoparticles or a conducting polymer. In implementations, interferometric lithography is used to define the structures in the photoresist. The structures undergo significant shrinkage during pyrolysis, but they maintain their pattern morphology and adhesion to the substrate.

For specific applications in electrocatalysis, for example, the porous carbon material can be decorated by electrochemically depositing metal nanoparticles of, e.g., gold, palladium, or silver, or by electrochemical deposition of conductive polymers. Other methods of decorating the microporous carbon scaffolds include evaporative deposition of thin films.

The technology of composite materials offers many opportunities to make more robust structures, to incorporate new functionality into known structures, and to make new structures that could not otherwise exist. In the realm of micro-fabrication, the ability to make composite materials that are structured in the range from the microscale to the nanoscale offers particularly great opportunities for advancing this technology.

The decorated carbon scaffolds described in U.S. Pat. No. 8,349,547 provide one example of microscale or nanoscale composite materials. These materials offer great promise, even though the foreign materials added to the carbon scaffolds are generally confined to interfacial areas such as external surfaces of the scaffold and the walls and interiors of voids in the scaffold. Still greater opportunities to enhance the mechanical, electrical, optical, and electrochemical properties of the carbon structure may be enjoyed if the nanoparticles can be more intimately mixed with the pyrolytic carbon.

SUMMARY OF THE INVENTION

As used below in describing carbon scaffolds, the term "microporous" means that the scaffold contains one, two, or three dimensional voids having an average diameter less than ten micrometers. It will be understood in this regard that a typical one-dimensional void is a tunnel or trench, and that the "diameter" of such a feature is the gap size or transverse width. As used below, the term "nanoparticle" refers to particles that on average are one micrometer or less in diameter.

We have found a method for creating microporous pyrolytic carbon scaffolds in which foreign nanoparticles are intimately mixed with the pyrolytic carbon. In our new technique, a photoresist is patterned by three-dimensional (3D) interferometric lithography and pyrolyzed as described in U.S. Pat. No. 8,349,547. Additionally, the photoresist is doped with nanoparticles prior to the 3D patterning, so that in the patterned resist state, the nanoparticles are incorporated in the patterned structure. Upon pyrolysis, the resist is converted to carbon while the nanoparticles remain embedded in the structure. The result is a carbon composite loaded with nanoparticles with submicrometer 1-D, 2-D or 3-D morphology. These composites can have enhanced mechanical, electrical, optical, and electrochemical behaviors compared to standard pyrolyzed carbon structures.

Accordingly, an embodiment of the invention in a first aspect is a method comprising mixing a load of foreign particulate matter into a carbon-containing photoresist, depositing the photoresist onto a substrate, lithographically defining a microporous structure in the deposited photoresist, developing the lithographically defined photoresist, and pyrolyzing the developed photoresist to provide a microporous carbon structure in which the particulate matter or a particulate product thereof is dispersed.

An embodiment of the invention in a second aspect is a material body comprising a microporous scaffold composed substantially of carbon, and further comprising a dispersion of foreign nanoparticles that are intimately mixed into the scaffold.

An embodiment of the invention in a third aspect is a material body comprising a microporous scaffold composed substantially of carbon, in which pores are defined on a larger scale and on a smaller scale, and in which the smaller-scale pores are the product of subtracting particulate matter from the carbon scaffold.

BRIEF DESCRIPTION OF THE DRAWINGS

FIG. 7A shows a structure made with undoped photoresist. FIG. 7B shows the structure that results when the photoresist is doped with 1 wt. % reduced graphene oxide (RGO) flakes. FIG. 7C shows the structure that results when the photoresist is doped with 3 wt. % RGO flakes.

FIG. 8A shows a structure made with undoped photoresist. FIG. 8B shows the structure that results when the photoresist is doped with 1 wt. % reduced graphene oxide (RGO) flakes. FIG. 8C shows the structure that results when the photoresist is doped with 3 wt. % RGO flakes.

DETAILED DESCRIPTION

The fabrication method previously described in U.S. Pat. No. 8,349,547 can be used to produce microporous carbon films have areas as great as 10 cm$^2$ or even more. Interferometric lithography can be used to pattern thick photoresist films into three-dimensional periodic lattices. These structures can then be converted to carbon by pyrolyzing them under flowing forming gas. During pyrolysis, the non-carbon species in the resist polymer backbone are removed, while the bulk of the carbon remains.

The patterned structures undergo significant shrinkage, but they maintain their morphology and adhesion to the substrate. The degree of carbonization is a function of the pyrolysis temperature, which affects the DC conductivity. The resulting porous carbon structures achieve metallic conductivity when the pyrolysis temperature is 1000° C. or higher.

Figure 1:
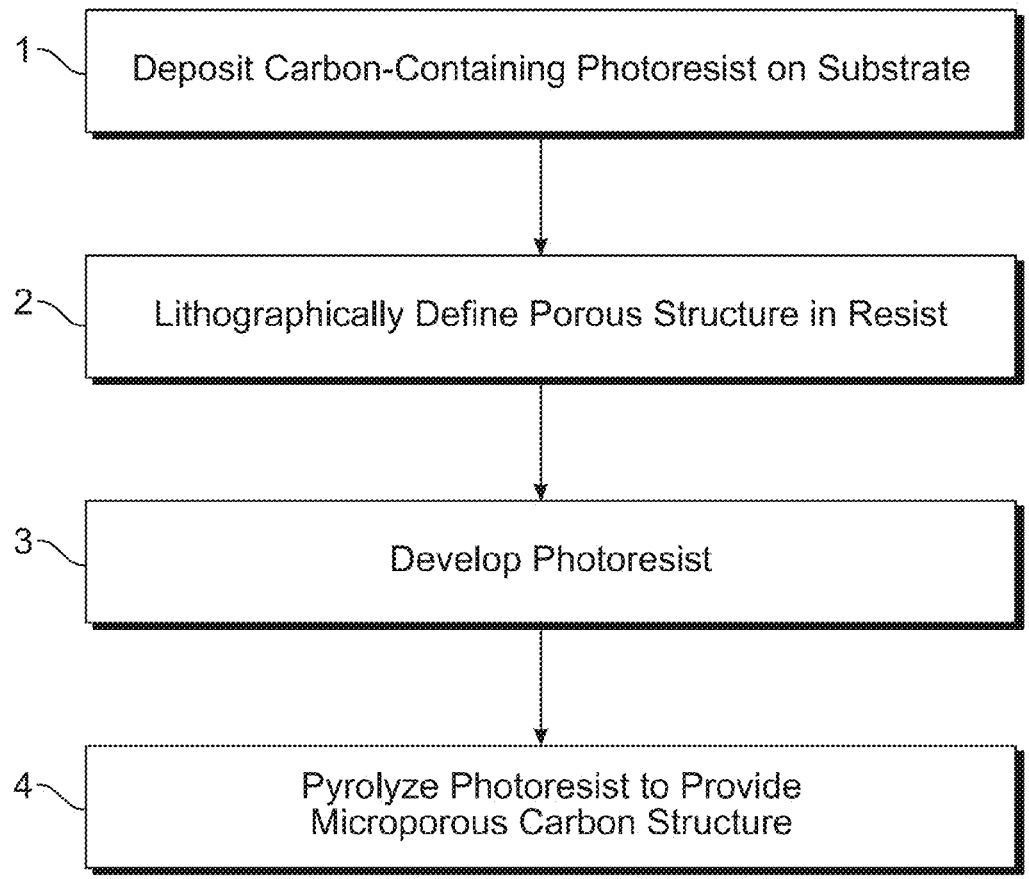
FIG. 1 is a flow diagram of a prior-art method to fabricate a lithographically defined microporous carbon structure.

With reference to FIG. 1, we now briefly review the fabrication method for lithographically defined microporous carbon structures that was described in U.S. Pat. No. 8,349,547.

The method comprises depositing a carbon-containing photoresist onto a substrate, lithographically defining a microporous structure in the deposited photoresist, developing the lithographically defined photoresist, and pyrolyzing the developed photoresist to provide a microporous carbon structure. In the following example, the microporous structure is lithographically defined in a negative photoresist using two-beam interferometric lithography. The photoresist is developed to remove the uncrosslinked portions of the exposed photoresist, and the developed photoresist is then pyrolyzed in a reducing atmosphere of hot forming gas to yield the porous carbon structure.

At step 1, formation of a microporous carbon structure begins with deposition of a carbon-containing photoresist onto a substrate. The substrate can be any material that is compatible with subsequent processing at the pyrolysis temperature, which may lie, e.g., in the range 900° C.-1200° C. Exemplary substrates are made of silicon, silica, or sapphire.

It is advantageous to spin-coat the substrate with a bottom antireflection coating (BARC). One example of a BARC useful in this regard is i-CON RTM-7, which is a thin i-line antireflection coating sold by Brewer Science, having offices in Rolla, Mo., USA. The antireflection coating is spun onto a plasma-cleaned silicon wafer and baked on a vacuum hotplate at 205° C. for 60 seconds. A thin adhesion layer, exemplarily about 100 nm in thickness, of negative resist is deposited and spun onto the anti-reflection coating at 3000 RPM. One example of such a resist is NR7-100P, which is a negative resist sold by Futurrex, Inc. having offices at Franklin, N.J., USA. The adhesion layer is cross-linked by a flood exposure followed by a post-exposure bake at 130° C. on a vacuum hotplate. Next, a thick layer (e.g., a layer of about 6 μm thickness) of NR7 is spun onto the substrate at 3000 RPM and soft baked at 130° C. for 120 seconds on a vacuum hotplate.

At step 2, a porous structure is lithographically defined in the photoresist. Interferometric lithography is our preferred method for defining the porous structure. As is known to those skilled in the art, interferometric lithography (IL) is a maskless lithographic technique in which coherent plane waves are combined to form an interference pattern. The intensity distribution of the interference pattern is recorded in the photoresist.

Because it is maskless, IL can be used to generate volumetric exposures. The geometry of the exposed resist is controlled by the number of beams and the relative angles of the interfering plane waves incident on the resist from the respective beams.

For example, a three-dimensional face-centered cubic (fcc) structure can be created in a single exposure using four interfering beams. However, polarization control is needed in four-beam interferometry in order to ensure maximum contrast between each of the four beams. For that reason, it is generally preferable to use two-beam IF, for which the optical system is simpler and more flexible. The two-beam technique can be used to define large and uniform 3D structures.

FIGS. 2A-2D provide examples of resist structures that can be defined using the two-beam technique. They are, respectively, a 1D structure using a single two-beam exposure, a tilted 1D structure using a single two-beam exposure, a 2D structure using two separate two-beam exposures, and a 3D structure using three separate two-beam exposures.

Figure 2A:
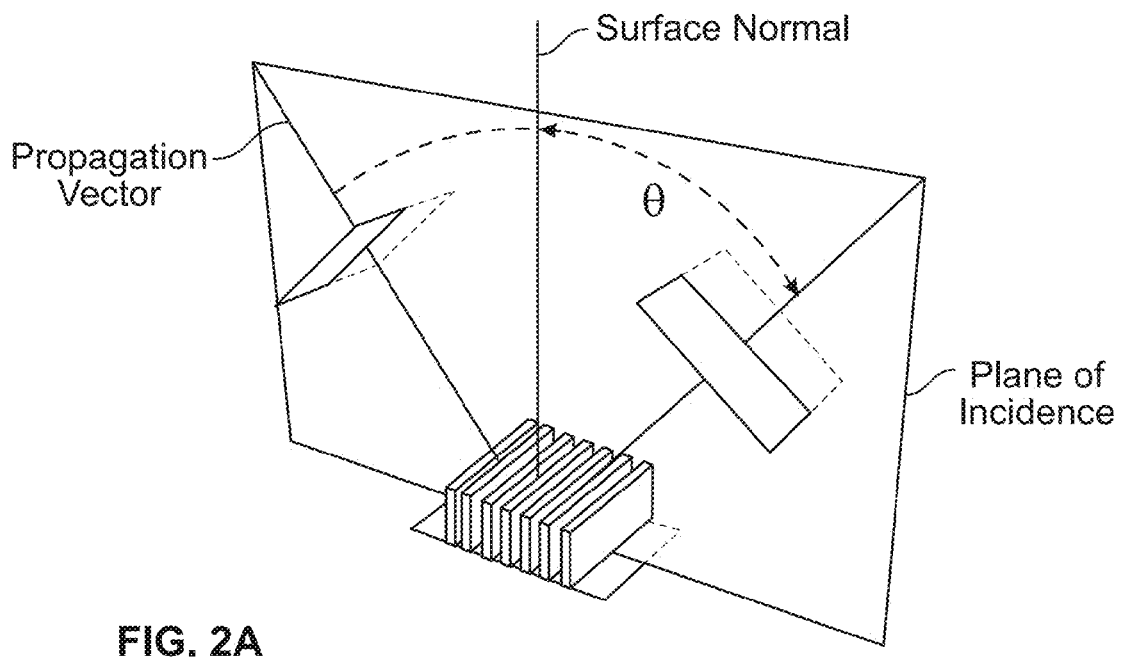
FIGS. 2A-D are schematic illustrations of interferometric lithography exposure geometries to achieve 1-D, tilted 1-D, 2-D, and 3-D structures, respectively, according to the prior-art method of FIG. 1.
Figure 2B:
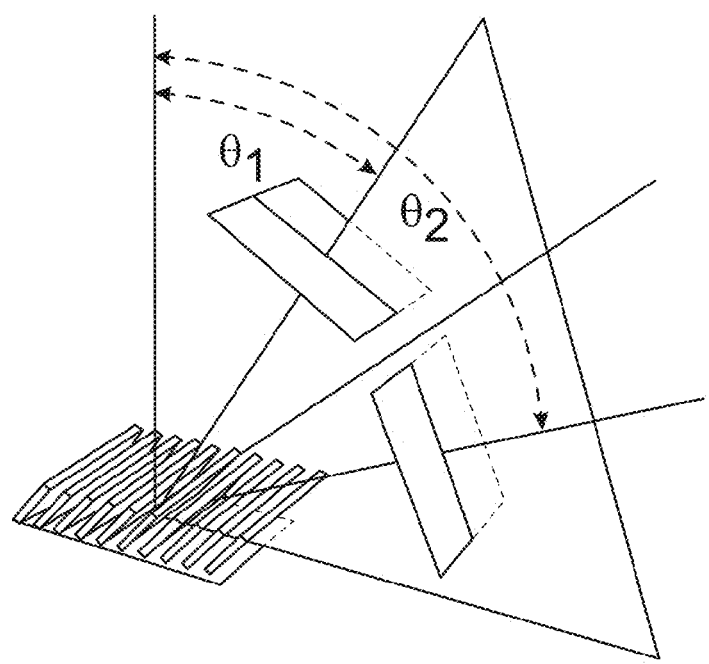
Figure 2C:
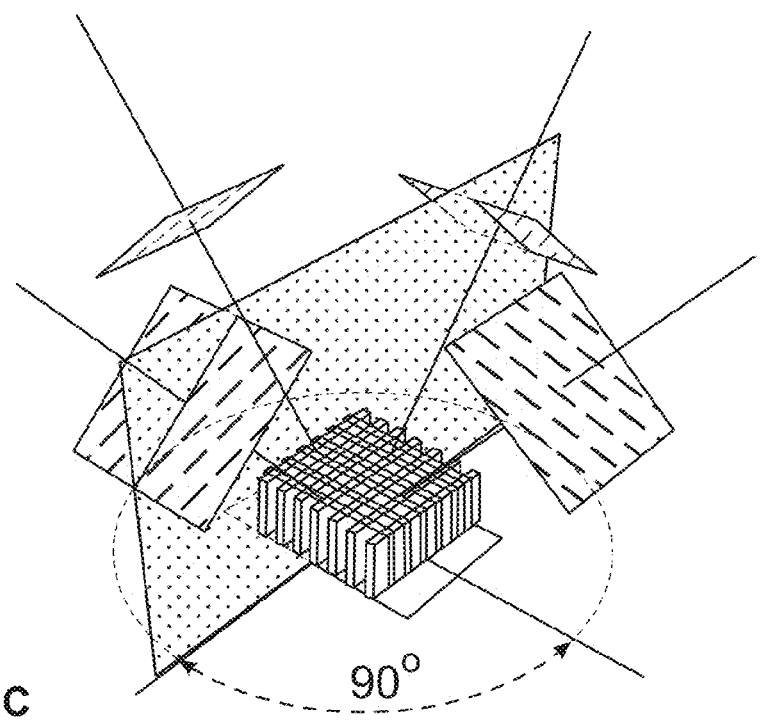
Figure 2D:
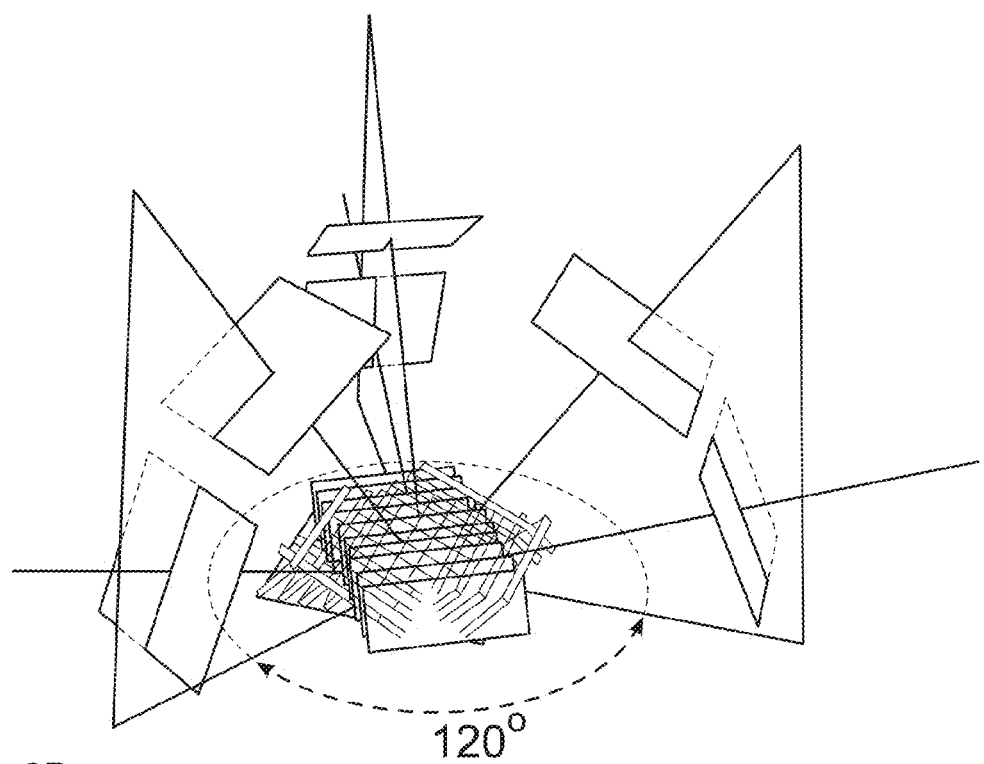
Figure 3A:
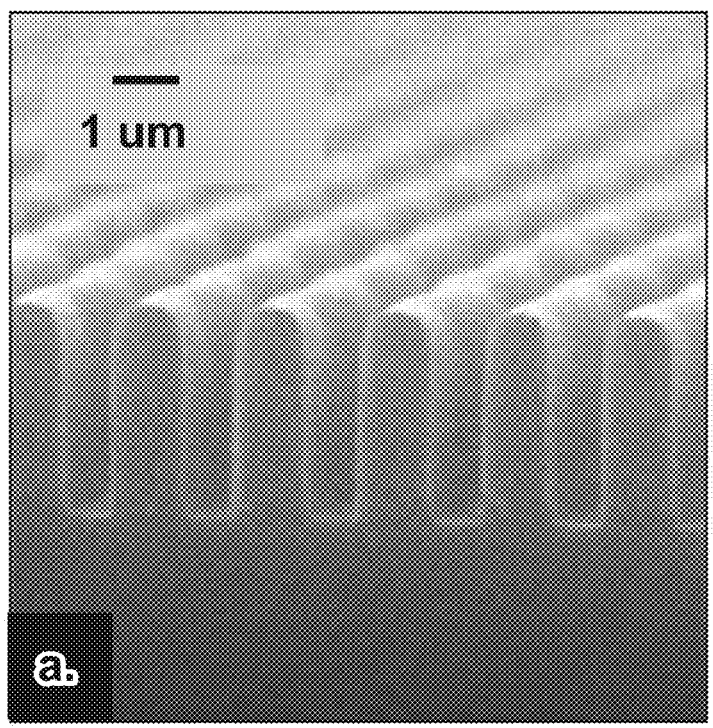
FIGS. 3A-D are cross-sectional scanning electron microscope (SEM) images showing some exemplary resist structures that can be made using the exposure geometries of FIGS. 2A-D.
Figure 3B:
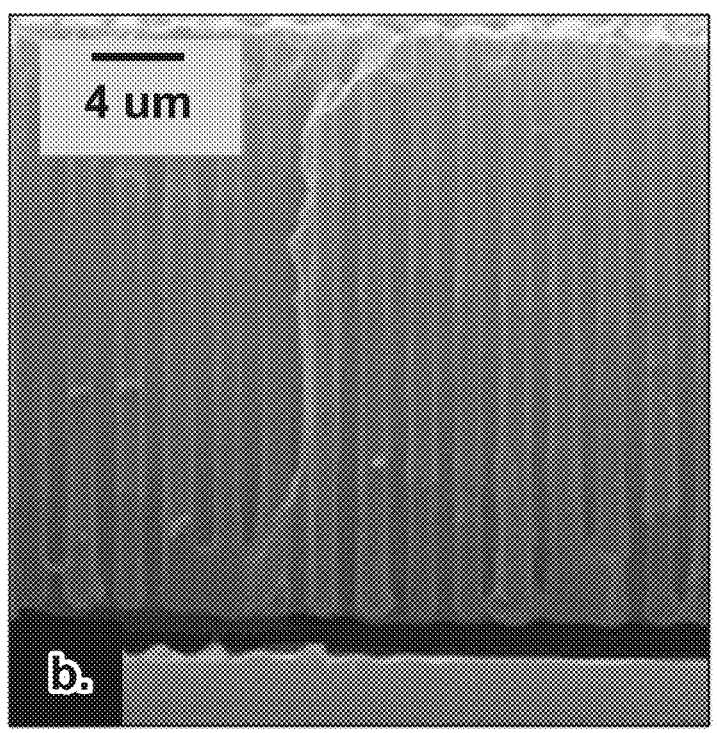
Figure 3C:
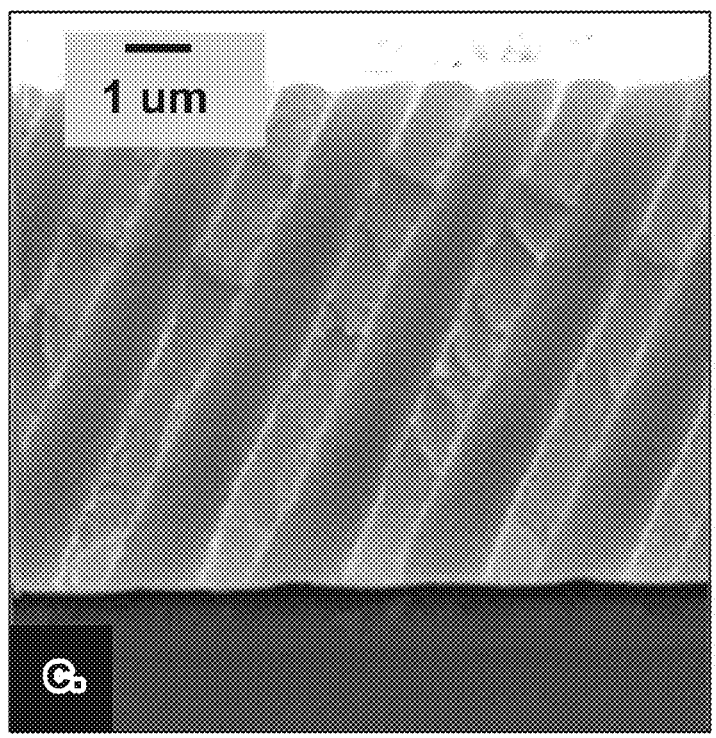
Figure 3D:
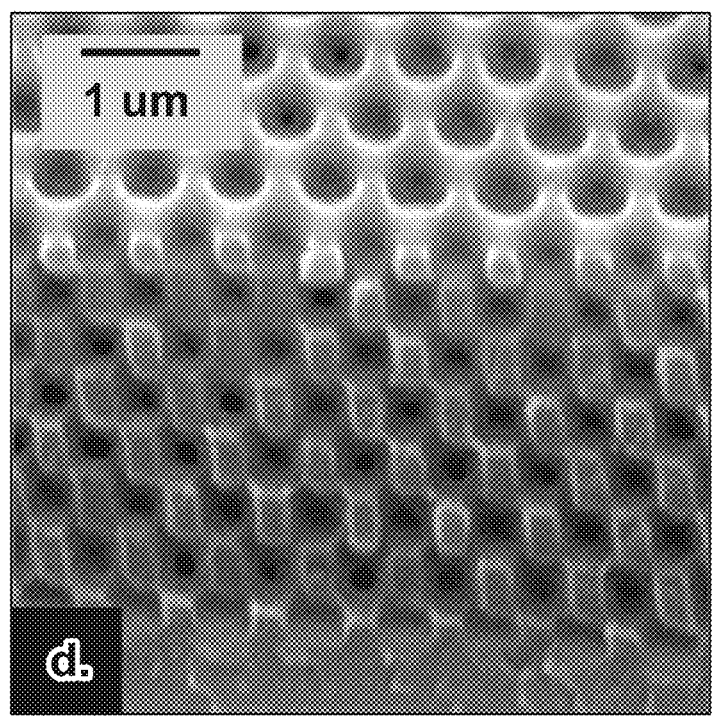

As shown in FIG. 2D, a 3D structure can be defined using three separate two-beam exposures. In each exposure, the two laser beams are maintained in a fixed relative position. There is an in-plane sample rotation of 120° between exposures. Further information about this technique may be gained from Y. Liu et al., *Proc. SPIE* 5450, 473 (2004), which is incorporated herein by reference.

The frequency-tripled 355 nm line of a Q-switched Nd:YAG laser can be used to form the inference pattern by i-line lithography. In an exemplary procedure, the laser beam is expanded and split into two separate beams, which are mutually interfered at a 32° angle between the respective plane-wave propagation vectors. The plane of incidence contains both propagation vectors as well as the angle bisector of the propagation vectors. The angle bisector is tilted by 45° from the normal to the sample surface.

After each exposure, the sample is rotated in the plane by 120° degrees. The process is repeated a total of three times.

The fringe separation, i.e. the spacing between the high-intensity regions of the interference pattern incident on the resist, is determined by the angle between the interfering beams. Increasing the angle between the beams reduces the fringe separation and hence the spacing between the features in the resulting structure.

At step 3, the lithographically defined photoresist structure is developed. The exposure geometry illustrated in FIG. 2D results in a volumetric interference pattern which causes cross-linking in the thick negative resist in regions of high intensity. A post-exposure bake of 85° C. for two minutes on a vacuum hotplate completes the cross-linking process in the exposed regions.

The development of the resist is completed by, e.g., puddle development using resist developer RD6 (a product of Futurrex, Inc.) followed by spin drying.

With careful control over the relative spatial phase between the three exposures, substantially defect-free three-dimensional lattices can be made by the process described above with substantially uniform sub-wavelength periodicity over a square sample area of side length greater than 2 cm.

To pattern larger areas, beam-expanding optics can be used to expand the interfering beams, resulting in expansion of the interference pattern.

FIGS. 3A-D are cross-sectional scanning electron microscope (SEM) images respectively showing a 1-D, a tilted 1-D, a 2-D, and a 3-D structure using the respective exposure geometries of FIGS. 2A-D.

Figure 4A:
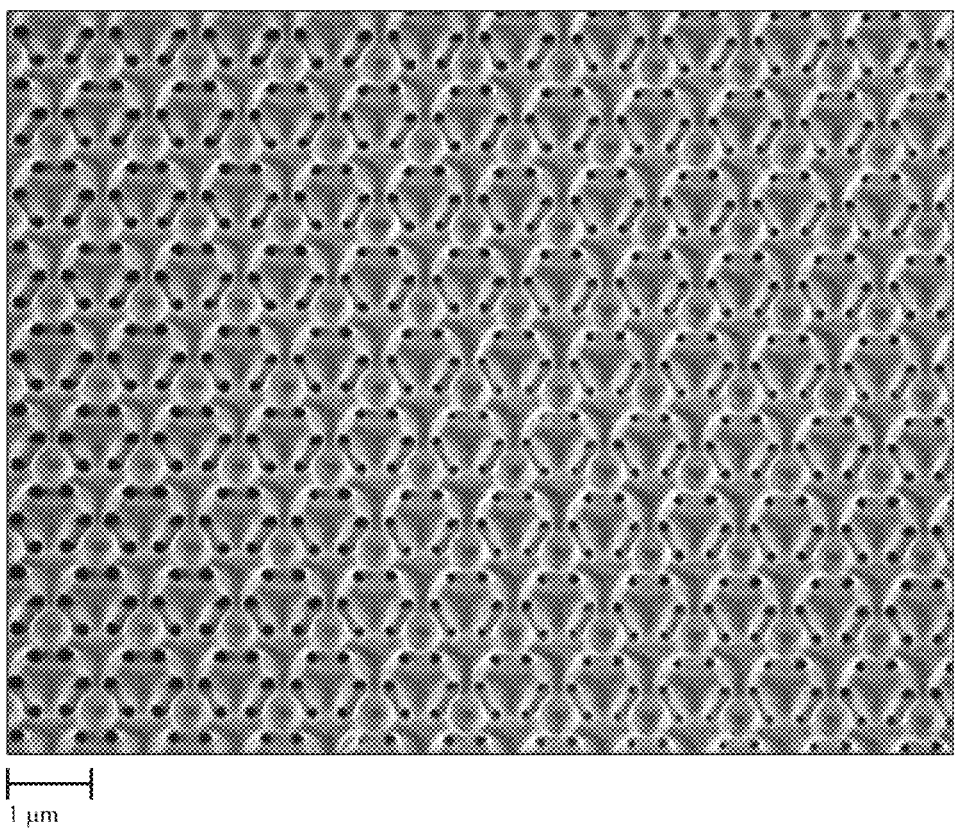
FIG. 4A is a low magnification scanning electron micrograph (SEM) image of lithographically defined 3-D photoresist structure after development according to the prior-art method of FIG. 1.
Figure 4B:
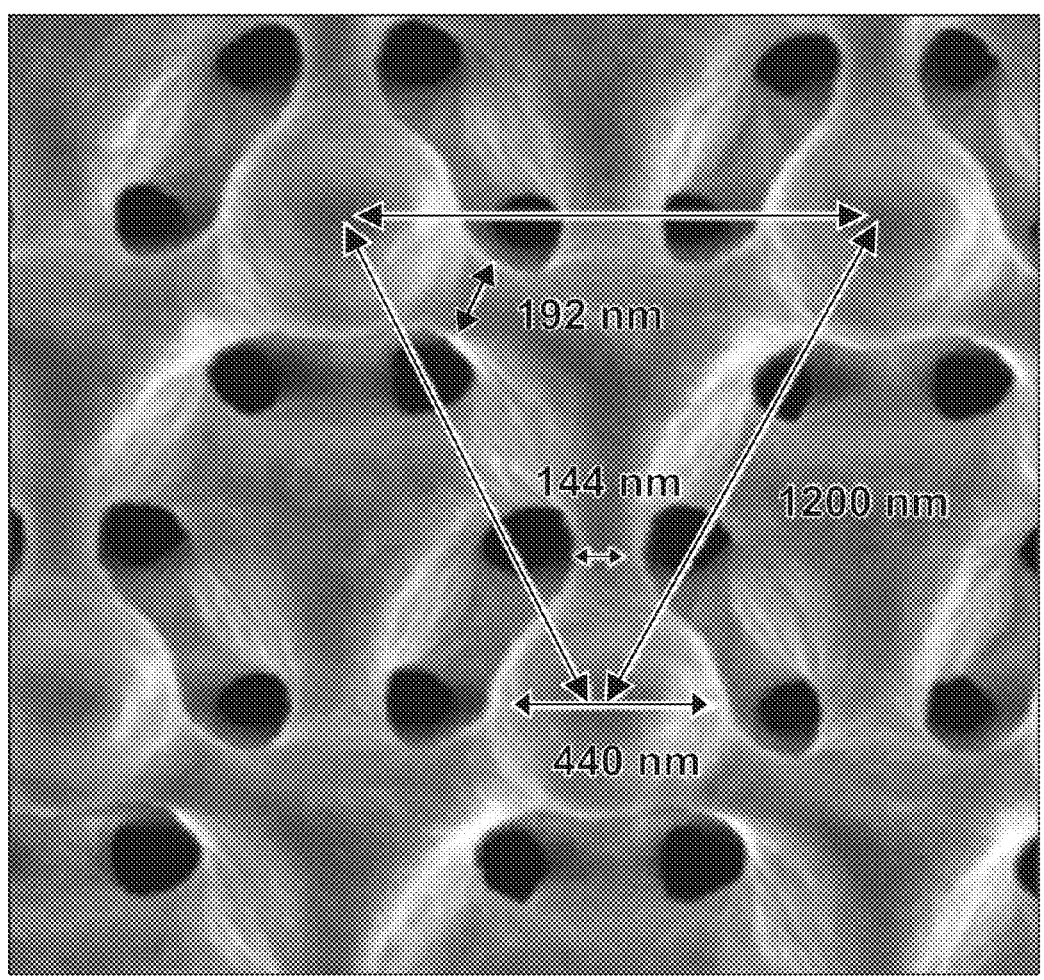
FIG. 4B is a high magnification SEM image of the photoresist structure.

FIG. 4A shows a low-magnification scanning electron micrograph (SEM) image of a developed 3D photoresist pattern. FIG. 4B provides a detail of the image at higher magnification marked with pertinent geometrical dimensions. As seen in the figures, the structure consists of nominally spherical nodes connected by spokes in a triangular lattice. Some slight variation in the pore diameter is seen, but the degree of uniformity seen in the resist structure is consistent over the entire 2.5 cm×2.5 cm sample.

Because the interference pattern extends through the depth of the resist, high aspect ratio structures can be made in thick resist. Alternatively, starting with a thinner resist will produce a structure with fewer layers. The development time for an exemplary thick structure was 120 seconds. Over this relatively long interval, the top layer of the structure was exposed to developer longer than the bottom layer. This resulted in a spoke diameter on the top layer that was noticeably smaller than the spoke diameter on the lower layers.

At step 4, the developed photoresist is pyrolyzed, thereby yielding the microporous carbon structure. For example, the fully formed resist structure with the 3D periodic geometry shown in FIG. 4 is placed in a tube furnace with flowing forming gas (5% hydrogen, 95% nitrogen) and heated to 1050° C. at a ramp rate of 5° C. per minute, maintained isothermally for one hour, and cooled to room temperature at the same or a similar ramp rate.

Figure 5A:
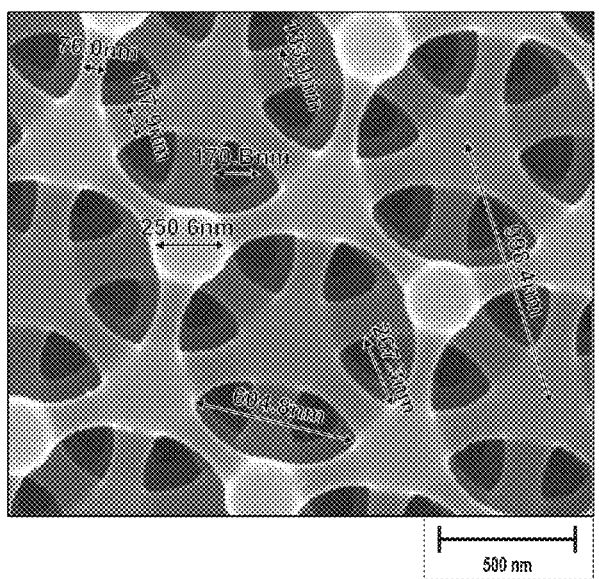
FIG. 5A is a low magnification SEM image of a lithographically defined 3-D pyrolyzed carbon structure made according to the prior-art method of FIG. 1.
Figure 5B:
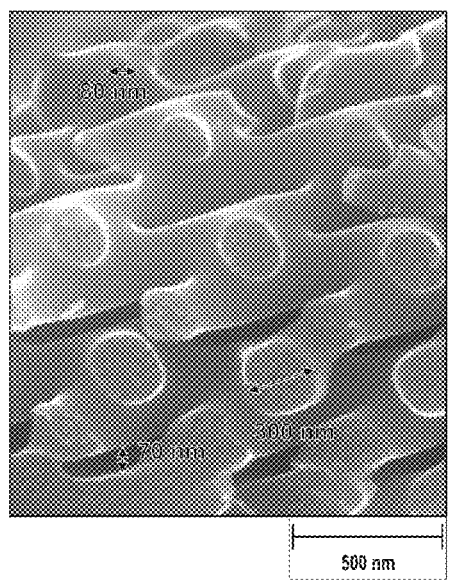
FIG. 5B is a cross-sectional view SEM image of the 3-D pyrolyzed carbon structure. Dimensions useful for characterizing the structure are indicated in the figure in nanometers.

In an experimental trial, pyrolyzing the structure of FIG. 4 as described above yielded the product shown in FIGS. 5A-5B. As seen in the figures, the product was a carbon scaffold of spokes and vertices in which five interconnected layers defined an array of hexagonal pores. In the top layer, spherical nodes situated at the vertices where three spokes converge were about 250 nm in diameter. In the second layer, similar nodes were about 500 nm at the second layer. The pore openings were about 600 nm as measured from the top layer to the second layer and about 300 nm as measured from the top layer to the third layer. The spoke diameter at the bottom layer was about 300 nm. The spoke diameter at the top layer was about 80 nm. The layer-to-layer separation as measured between spokes in the respective layers was somewhat more than 60 nm.

Earlier studies have shown that the lithographically defined patterns tend to shrink as much as 80% in the vertical direction and about 50% in the horizontal direction during pyrolysis. (In this context, "vertical" and "horizontal" are defined relative to the substrate.) Our results were roughly consistent with this rule-of-thumb. For example, the initial resist structure of FIG. 4 had a thickness of about 6000 nm before pyrolysis and a thickness of about 1700 nm after pyrolysis. The same structure had a vertical period of about 1400 nm before pyrolysis and a vertical period of about 450 nm after pyrolysis.

As will be apparent from FIG. 5, the relatively dense photoresist structure of FIG. 4 is transformed by pyrolysis to a sparse carbon structure. However, it will also be apparent that the triangular symmetry is largely maintained. Some distortion of the matrix is clearly in evidence, but the resultant lattice dimension only decreased by about 5%, whereas the diameter of the nodes decreased by 40%. By "lattice dimension" is meant the distance between the nodes forming the triangular in-plane lattice. The spoke diameter on the top layer of the structure decreased by 80%, whereas the spokes on the second layer decreased in diameter by 60%.

Throughout the pyrolysis process, the structures maintain adhesion to the substrate, so that the final carbon structures possess a rigid support. Silicon and glassy carbon both possess similar thermal expansion coefficients. However, similar results were also obtained when pyrolysis was performed using fused silica and sapphire substrates.

We have observed that the combination of lateral shrinkage and simultaneous adhesion to the substrate results in formation of a foot-like feature at the interface between the carbon structure and the substrate.

Those skilled in the art will recognize that in the example described above, the lithographically structured resist was a chemically amplified, phenolic resin, negative resist. It should be noted, however, that various other positive and negative resists, such as patterned positive tone novolac resin resists and photo-epoxy SU-8, can also be pyrolyzed with similar results.

As explained above, our new method patterns and pyrolyzes the resist as described above. Additionally, foreign particulate matter is added to the resist before it is patterned. By "foreign particulate matter" is meant any added particulate material leading to inclusions that, after pyrolysis, are chemically or physically distinguishable from the surrounding carbonaceous material resulting directly from the pyrolysis of the photoresist. The inclusions that are present after pyrolysis may be of the same composition as the particulate matter added to the photoresist, or they might be, e.g., the products of chemical reactions of the added particulate matter that take place during the pyrolysis stage.

More specifically, foreign particulate matter consisting of colloidal particles, flakes, or the like is synthesized and then dispersed in a suitable carrier liquid to form a suspension. We use the term "nanoparticles" to refer to particles of any such material that are smaller than one micrometer in maximum diameter. We use the term "nanomaterials" to refer to any materials that consist substantially of nanoparticles. The carrier liquid is typically an organic solvent and is preferably the same as, or similar to, a component of the photoresist as commercially supplied or as prepared for application. In specific examples of nanomaterials, the diameters of the nanoparticles may range down to 10 nm or even less.

The nanoparticle suspension is then mixed with the photoresist so as to disperse the material homogenously throughout the resist. The step of mixing foreign particulate matter into the photoresist in indicated at step 10 of FIG. 6, to which further reference is made below.

As indicated at step 11 of the figure, the photoresist is then applied to a substrate. At step 12, the photoresist is lithographically patterned and at step 13 is it developed substantially as described above with reference to FIG. 1.

The advantage of this approach is that the photoresist can be patterned optically so as to define the final desired structure without requiring additional processing. The foreign nanomaterials remain in place as particles that are embedded in such portions of the photoresist as remain after development.

Interferometric lithography has been described above as a preferred method for patterning the photoresist. Indeed, interferometric lithography offers the possibility of creating 1D, 2D, and 3D structures that have sub-micron scale and even deeply sub-micron scale features in the resist state. However, the photoresist can in fact be patterned by any method known for patterning standard photoresist, and the use of all such methods is included within the scope of the present invention. Examples of such methods are mask-based planar lithography and photolithography using steppers.

Figure 6:
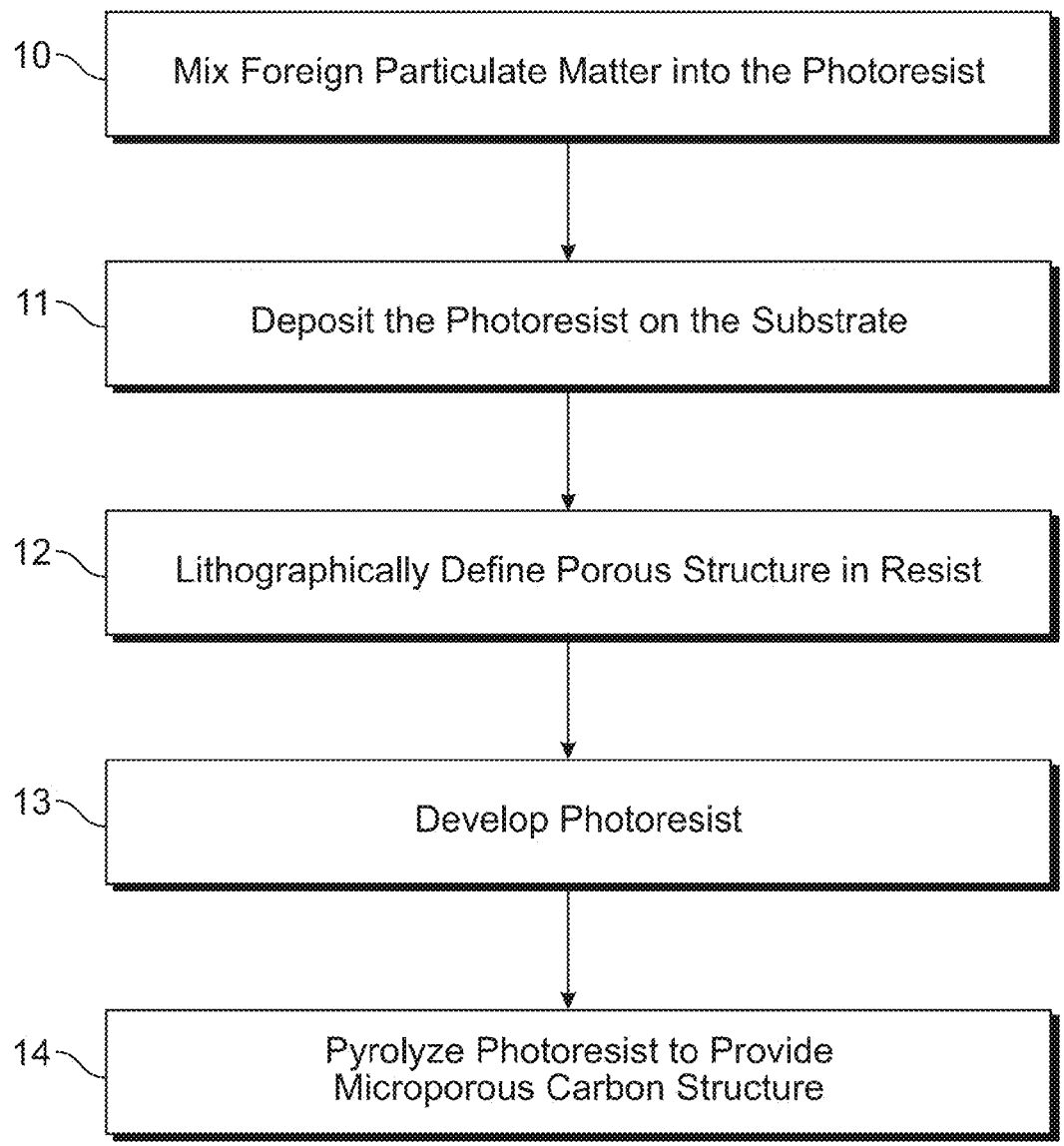
FIG. 6 is a flow diagram of a method to fabricate a lithographically defined microporous carbon structure loaded with nanoparticles according to an embodiment of the present invention.

After the resist has been developed, it is pyrolyzed as indicated at step 14 of FIG. 6. To pyrolyze the resist, it is heated in a reducing atmosphere such as flowing forming gas to convert it to amorphous carbon. As noted, the electrical conductivity of the resulting carbon structure depends on the pyrolysis temperature. The maximum conductivity achievable in a carbon structure, i.e. "metallic" conductivity, is achieved when the pyrolysis temperature is 1000° C. or more.

During the pyrolyzing process, most of the low-molecular-weight elements in the resist (other than carbon) become volatile and boil off while the carbon atoms remain behind. The structure undergoes significant shrinkage, but otherwise maintains its 1D, 2D or 3D morphology. In particular, we have observed that the triangular lattice structure of the patterned resist is preserved after shrinkage in the carbon scaffold.

Provided the incorporated nanoparticles are chemically and structurally stable during pyrolysis, they remain embedded in the carbon, resulting in a carbon composite structure after pyrolysis has been completed. Significantly, the nanoparticles are not excluded from the carbon phase, but instead are substantially dispersed in the carbon so as to form a single, continuous intermixed phase.

In one useful application, the incorporated nanoparticles serve as a stiffening agent for the scaffold of amorphous carbon. An example preparation of a carbon scaffold that incorporates flakes of reduced graphene oxide as a stiffening agent is provided below.

In another useful application, the nanoparticles are incorporated as a sacrificial material for making nanoporous carbon. That is, nanoparticles are incorporated in the carbon scaffold as described above. The nanoparticles are then etched away to leave pores less than one micrometer in size, and potentially to leave pores as small as tens of nanometers in diameter or even less.

In one example of the sacrificial approach, silica nanoparticles are dispersed in the resist, which is then patterned as described above to create a 3D structure with micrometer-scale voids. After pyrolysis, the silica particles are removed by a hydrofluoric acid etch, leaving nanometer-scale pores behind in the walls of the carbon scaffold. Such a process can produce a dramatic increase in the surface area of the carbon scaffold, which would be advantageous for applications in electrodes for electrochemical sensors and batteries, among others.

For some applications, the nanometer-scale pores can subsequently be refilled by, e.g., electrodeposited material. This would be useful, for example, when the dispersed particles in the final product are of a composition that is too temperature-sensitive to survive the pyrolysis step.

As noted above, the nanoparticles can be selected from a wide range of sizes. At one end of the range are relatively large particles, on the order of one micrometer diameter. At the other end of the range are particles that are tens of nanometers, or less, in diameter. One possible limit on the particle size is the size of the features that are to be lithographically defined, because achievable spatial resolution may be limited by the (typically fixed) size of the particles. Nanoparticles that are commensurate with, or larger than, the wavelength of the interfering lithographic beams may cause optical scattering that degrades the contrast in the interference pattern.

Nanoparticle compositions will be limited by the need to tolerate the high processing temperatures used for pyrolysis. As noted, the higher range of pyrolysis temperatures is useful for achieving high electrical conductivity in the final product. If high conductivity is not critical, lower temperatures can be used, thus inviting a greater range of candidate nanoparticle compositions.

Nanoparticle compositions will also be limited by the need for compatibility with the lithographic exposure process. In interferometric lithography, for example, the depth of penetration of the interference pattern into the resist may be limited if the nanoparticles are optically absorptive at the exposure wavelength. As noted above, the particles may scatter light if they are commensurate with or larger than the exposure wavelength. This will be especially true if the particles are opaque or provide substantial refractive index contrast relative to the resist. Index contrast may also degrade the interference pattern by locally changing the phase relationships between the interfering wavefronts.

Particle sizes and morphologies may also need to be chosen with reference to the rheological properties of the resist. That is, the gravitational settling of particles may cause particle density gradients in the deposited layer of resist on the substrate. Processing times may therefore need to be balanced against the settling times of the particles, which will depend in turn on particle sizes and morphologies and on the viscosity of the resist, among other factors.

Suitable nanoparticles may have any of various morphologies. Possible shapes include, without limitation, spheroids, flakes, needles, and plates, as well as dendritic and stellate structures.

EXAMPLE

One of the special properties of graphene is its extreme breaking strength and tensile modulus. Although high-strength structures of pure graphene would be of great interest, their successful fabrication is hindered by the difficulties that attend the synthesis and manipulation of pure graphene. Hence it is also of interest to create graphene-containing composites. Such materials, while more easily synthesized and manipulated than pure graphene, can enjoy enhanced strength due to the incorporated graphene particles.

We synthesized flakes of reduced graphene oxide (RGO) via the chemical reduction of improved graphene oxide (iGO) as described in C. M Washburn et al., "Tunable Young's Modulus in Carbon MEMS using Graphene-based Stiffeners", *ECS Transactions*, 50 (12) 423-434 (2012).

Briefly, approximately 600 mg of iGO was dispersed in deionized water (600 mL) and divided into two equal portions. The two mixtures were stirred for approximately 24 hours followed by bath sonication for 1 hour.

Immediately following sonication, the two portions were combined into a one-liter poly(methylpentene) bottle to which 3 milliliters of hydrazine hydrate was added with stirring. The bottle was sealed and the reaction was heated to 85° C. in an oil bath for 24 hours with continuous stirring. Upon completion, the reaction was removed from the heat and cooled. Black solids were isolated by filtration through a coarse fritted glass funnel.

The solid product was washed with one liter of deionized water and 0.5 liter of methanol and dried at 60° C. under vacuum. Additional aggregate solids that subsequently precipitated from the black filtrate were collected and washed as previously described. In general, the reaction yielded approximately 300 mg of iRGO.

The RGO flakes were suspended in solvent and then incorporated in a commercially available negative photoresist, which in our experiments was NR7-500P, a product of Futurrex, Inc.

A brief bath sonication of the composite photoresist was performed to optimize suspension before spin-coating onto a silicon wafer.

Interferometric lithography, substantially as described above, was used to pattern the photoresist with an array of parallel lines having a period of 400 nm.

Figure 7A:
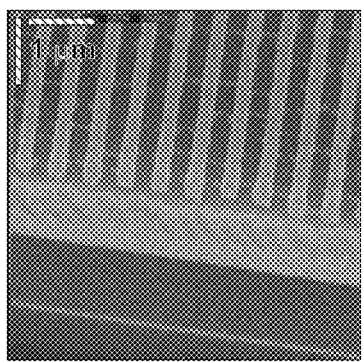
FIGS. 7A-7C are SEM images of a lithographically defined photoresist structure prior to pyrolysis. The structure is an array of parallel lines with a period of 400 nm.
Figure 7B:
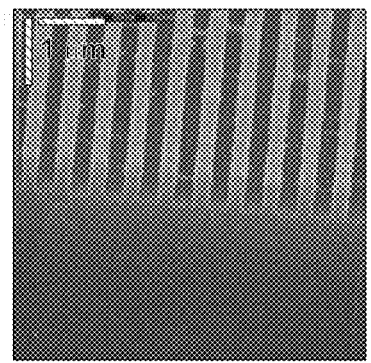
Figure 7C:
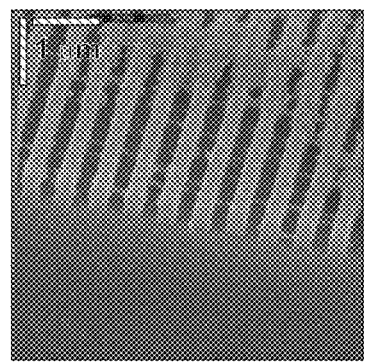

Comparative examples were prepared, in which the Futurrex NR7-500P photoresist was respectively undoped, doped with 1 wt. % RGO flakes, and doped with 3 wt. % RGO flakes. FIG. 7A is a SEM image of the resulting photoresist lines made using undoped photoresist. FIGS. 7B and 7C are corresponding SEM images of the resulting photoresist lines made using respectively the photoresist doped with 1 wt. % and 3 w.t % RGO flakes.

A small amount of photoresist is visible in the interstices between the lithographically defined lines in FIGS. 7A-7C. This is a consequence of non-optimized exposure and development parameters. In FIG. 7C, it is also evident that a macroscopic amount of RGO flakes has agglomerated and deposited on top of the lines in the 3 wt. % sample. These deposits were rare. They can be eliminated by filtering the resist to remove agglomerations before it is dispensed. Except for these macroscopic agglomerations, it is difficult to detect the presence of RGO flakes in the resist from visual inspection of the images.

Figure 8A:
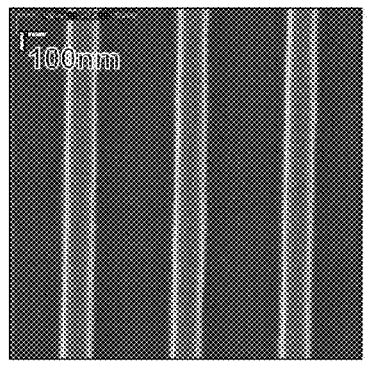
FIGS. 8A-8C are SEM images of a lithographically defined photoresist structure, similar to the structure of FIGS. 7A-7C, after pyrolysis. As in FIGS. 7A-7C, the structure has a 400-nm period.
Figure 8B:
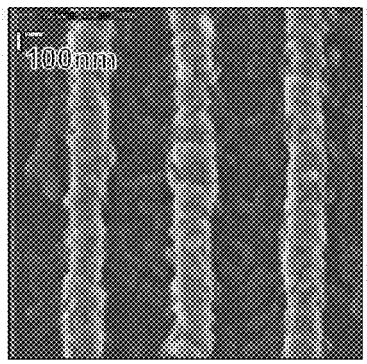
Figure 8C:
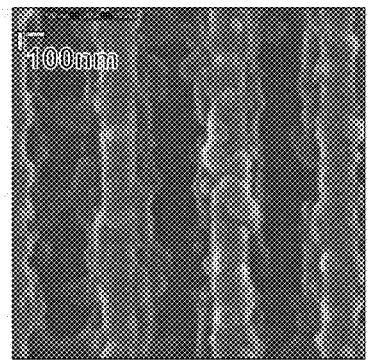

The patterned photoresist was pyrolyzed substantially as described above. FIGS. 8A, 8B, and 8C are post-pyrolysis SEM images of the patterned lines. FIGS. 8A, 8B, and 8C correspond respectively to FIGS. 7A, 7B, and 7C, so that FIG. 8A shows the result of pyrolyzing the undoped sample, FIG. 8B shows the result of pyrolyzing the 1 wt. % sample, and FIG. 8C shows the result of pyrolyzing the 3 wt. % sample. Upon inspection of the figures, it will be seen that the undoped sample of FIGS. 7A and 8A yielded smooth lines after pyrolysis, but the lines produced in the 1 wt. %-doped sample of FIGS. 7B and 8B as well as the 3 wt. %-doped sample of FIGS. 7C and 8C exhibited visible roughness that was obvious evidence of the embedded RGO flakes.

It will be evident from comparison of FIGS. 7A-7C to FIGS. 8A-8C that the large volumetric shrinkage that the photoresist undergoes during pyrolysis can concentrate the embedded nanoparticles so that nanoparticles that were widely separated in the resist are brought much closer together after pyrolysis. Consequently, a lower doping density in the resist state can lead to a higher relative weight fraction in the final carbon composite. This effect can be very useful, not least because nanoparticles of some compositions, unless very dilute, can impair the imaging properties of the photoresist. For example, particles that are optically absorptive at the wavelength of the interfering beams might prevent the interference pattern from penetrating to sufficient depth within the photoresist. Because pyrolysis increases the final density of the dopant particles, they can be introduced to the photoresist at sufficient dilution to permit effective exposure of the photoresist, while possibly achieving an effective concentration in the final product to be effective for their intended purpose.

We claim:

1. A method for making a composite structure, comprising:
    mixing foreign particulate matter into a carbon-containing photoresist;

depositing the photoresist onto a substrate;
lithographically patterning the deposited photoresist to define a microporous structure therein;
developing the patterned photoresist; and
pyrolyzing the developed photoresist so as to yield a microporous carbon scaffold in which the particulate matter or a particulate product thereof is dispersed in a single, continuous intermixed phase of carbon and particulate matter or particulate product.

2. The method of claim 1, wherein the lithographic patterning is performed by interferometric lithography.

3. The method of claim 1, wherein the lithographic patterning is performed so as to define a three-dimensional microporous structure in the photoresist.

4. The method of claim 1, wherein the foreign particulate matter comprises flakes of graphene.

5. The method of claim 1, further comprising, after the pyrolyzing step, the step of subtracting the particulate matter or particulate product thereof from the microporous carbon structure so as to leave behind a plurality of pores commensurate in scale to the foreign particulate matter.

* * * * *